United States Patent
Pranatharthiharan et al.

(10) Patent No.: US 10,559,654 B2
(45) Date of Patent: Feb. 11, 2020

(54) NANOSHEET ISOLATION FOR BULK CMOS NON-PLANAR DEVICES

(71) Applicant: International Business Machines Corporation, Armonk, NY (US)

(72) Inventors: Balasubramanian Pranatharthiharan, Watervliet, NY (US); Injo Ok, Loudonville, NY (US); Soon-Cheon Seo, Glenmont, NY (US); Charan Veera Venkata Satya Surisetty, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 211 days.

(21) Appl. No.: 15/826,375

(22) Filed: Nov. 29, 2017

(65) Prior Publication Data

US 2018/0090566 A1    Mar. 29, 2018

Related U.S. Application Data

(63) Continuation of application No. 14/936,215, filed on Nov. 9, 2015, now Pat. No. 9,871,099.

(51) Int. Cl.
*H01L 29/06* (2006.01)
*H01L 29/78* (2006.01)
(Continued)

(52) U.S. Cl.
CPC .......... *H01L 29/0649* (2013.01); *B82Y 10/00* (2013.01); *H01L 21/30604* (2013.01);
(Continued)

(58) Field of Classification Search
CPC ... H01L 27/101; H01L 27/1021; H01L 45/06; H01L 45/1233; H01L 45/12;
(Continued)

(56) References Cited

U.S. PATENT DOCUMENTS

| 8,691,640 | B1 | 4/2014 | Licausi et al. |
| 2012/0171837 | A1* | 7/2012 | Kim ............ H01L 27/101 |
| | | | 438/382 |
| 2012/0319178 | A1* | 12/2012 | Chang ............ B82Y 10/00 |
| | | | 257/287 |

FOREIGN PATENT DOCUMENTS

EP    2738814 A1    6/2014

OTHER PUBLICATIONS

List of IBM Patents or Patent Applications Treated as Related dated Nov. 29, 2017, 2 pages.

* cited by examiner

*Primary Examiner* — Fernando L Toledo
*Assistant Examiner* — Lawrence-Linh T Nguyen
(74) *Attorney, Agent, or Firm* — Scully, Scott, Murphy & Presser, P.C.; Steven J. Meyers

(57) ABSTRACT

A semiconductor structure is provided that includes a semiconductor substrate including a first device region and a second device region. First trench isolation structures surround the first and second device regions and extend below first and second pedestal portions of the semiconductor substrate. A first semiconductor material fin stack is located above the first pedestal portion of the semiconductor substrate, and a second semiconductor material fin stack is located above the second pedestal portion of the semiconductor substrate. Second trench isolation structures are located at ends of each first and second semiconductor material fin stacks. A portion of each second trench isolation structure is located directly between a bottommost surface of the first or second semiconductor material fin stack and the first or second pedestal portion of the semiconductor substrate.

18 Claims, 8 Drawing Sheets

(51) Int. Cl.
*H01L 29/66* (2006.01)
*H01L 29/16* (2006.01)
*H01L 21/306* (2006.01)
*H01L 29/775* (2006.01)
*H01L 27/088* (2006.01)
*H01L 21/8234* (2006.01)
*H01L 29/423* (2006.01)
*B82Y 10/00* (2011.01)
*H01L 21/8238* (2006.01)

(52) U.S. Cl.
CPC ........ *H01L 21/823431* (2013.01); *H01L 21/823481* (2013.01); *H01L 27/0886* (2013.01); *H01L 29/0665* (2013.01); *H01L 29/16* (2013.01); *H01L 29/42376* (2013.01); *H01L 29/66439* (2013.01); *H01L 29/66795* (2013.01); *H01L 29/775* (2013.01); *H01L 29/785* (2013.01); *H01L 21/823878* (2013.01); *H01L 29/0673* (2013.01)

(58) Field of Classification Search
CPC ........... H01L 45/144; H01L 45/1683; H01L 27/2409; H01L 45/126; H01L 47/00
See application file for complete search history.

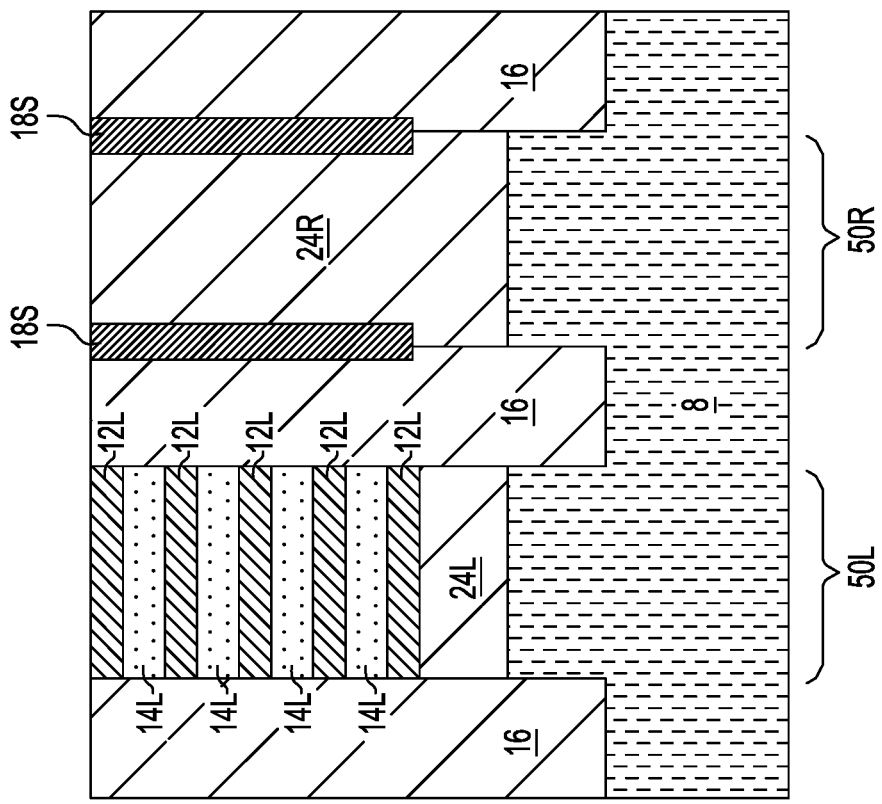
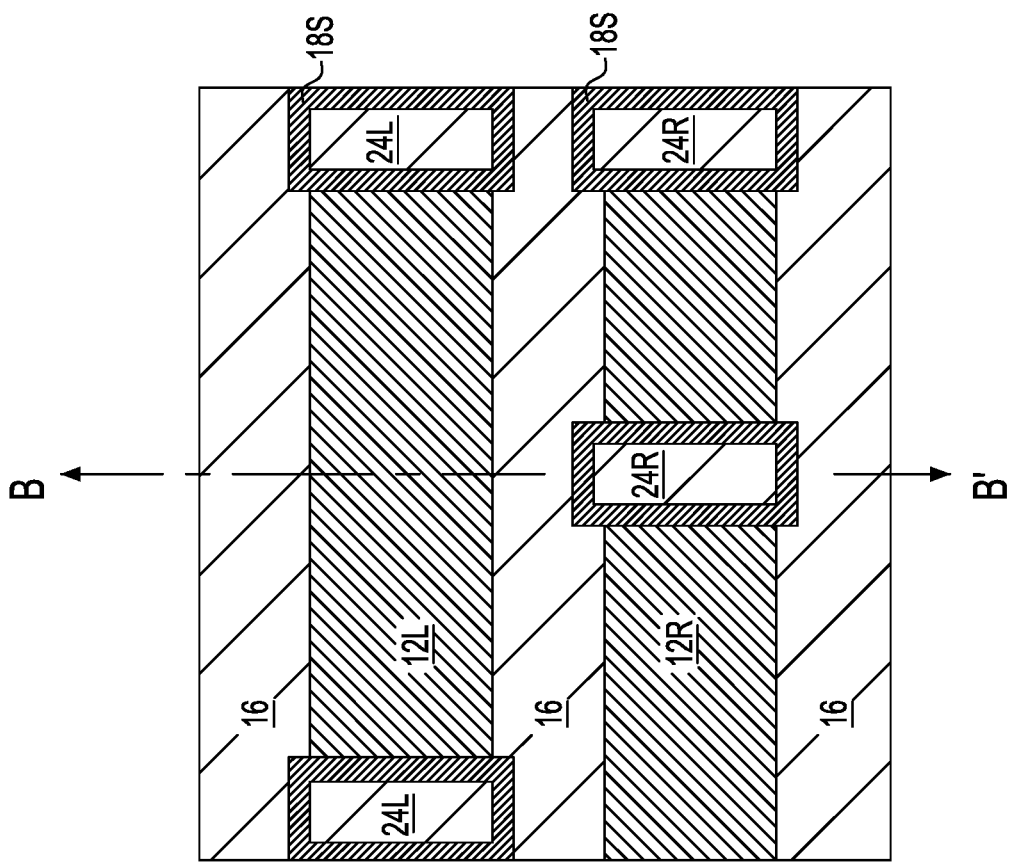
FIG. 6A
FIG. 6B

NANOSHEET ISOLATION FOR BULK CMOS NON-PLANAR DEVICES

BACKGROUND

The present application relates to semiconductor technology, and more particularly to a semiconductor structure that includes first and second semiconductor material fin stacks that are located in first and second device regions, respectively, of a semiconductor substrate and positioned between first trench isolation structures, and wherein second trench isolation structures are located at ends of the first and second semiconductor material fin stacks. A portion of the second isolation trench structure extends beneath the first and second semiconductor material fin stacks and separates the fin stacks from the underlying semiconductor substrate.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, Fin field effect transistors (FinFETs) and semiconductor nanowire transistors is the next step in the evolution of complementary metal oxide semiconductor (CMOS) devices. Such non-planar devices can achieve higher drive currents with increasingly smaller dimensions as compared to conventional planar FETs.

Bulk nanowire or FinFET isolation is not well practiced due to complications in nanowire or Fin formation. Most of the prior art proposals for forming such isolation is post fin formation or post-spacer processing. Prior art proposals for forming bulk nanowire or FinFET isolation complicate integration schemes and lead to the formation of numerous defects. As such, there is a need for providing bulk nanowire or FinFET isolation that avoids the problems mentioned above with prior art proposals of forming the same.

SUMMARY

In one aspect of the present application, a semiconductor structure is provided. In one embodiment of the present application, the semiconductor structure includes a semiconductor substrate including a first device region and a second device region, wherein first trench isolation structures surround the first and second device regions and extend below first and second pedestal portions of the semiconductor substrate. A first semiconductor material fin stack is located above the first pedestal portion of the semiconductor substrate, and a second semiconductor material fin stack is located above the second pedestal portion of the semiconductor substrate. The structure further includes second trench isolation structures located at ends of each first semiconductor material fin stack and each second semiconductor material fin stack, wherein a portion of one of the second trench isolation structures is located directly between a bottommost surface of the first semiconductor material fin stack and the first pedestal portion of the semiconductor substrate and a portion of another of the second trench isolation structures is located directly between a bottommost surface of the second semiconductor material fin stack and the second pedestal portion of the semiconductor substrate.

In another aspect of the present application, a method of forming a semiconductor structure is provided. In one embodiment of the present application, the method includes providing a first semiconductor nanowire material stack located in a first device region of a semiconductor substrate and a second semiconductor nanowire material stack located in a second device region of the semiconductor substrate. In accordance with the present application, the first semiconductor nanowire material stack is located on a first sacrificial silicon germanium alloy portion and the second semiconductor nanowire material stack is located on a second sacrificial silicon germanium alloy portion and a first trench isolation structure surrounds each of the first and second semiconductor nanowire material stacks. Next, an isolation spacer is formed along an upper portion of each first trench isolation structure. An entirety of the first and second sacrificial silicon germanium alloy portions is then removed to provide an opening within the first and second device regions. In accordance with the present application, each opening has a portion directly beneath the first and second semiconductor nanowire material stacks. A second trench isolation structure is then formed within each opening, wherein a portion of the second trench isolation structure with each opening extends directly beneath the first and second semiconductor nanowire material stacks.

BRIEF DESCRIPTION OF SEVERAL VIEWS OF THE DRAWINGS

FIG. 6A is a top down view of the exemplary semiconductor structure of FIGS. 5A-5B after forming a second trench isolation structure.

FIG. 6B is a cross sectional view of the exemplary semiconductor structure of FIG. 6A along the vertical plane B-B'.

DETAILED DESCRIPTION

Figure 1B:
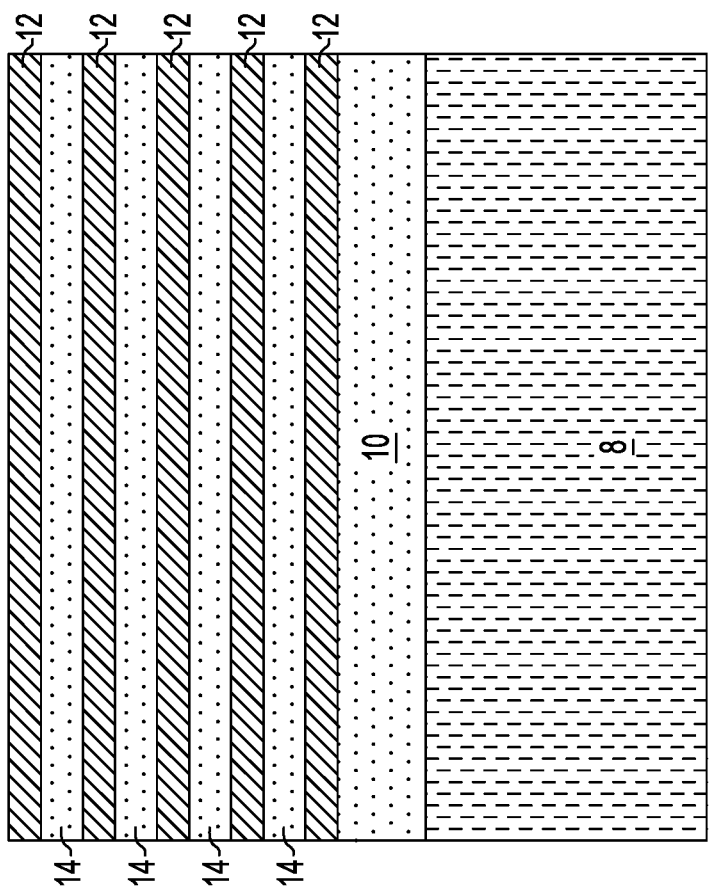
FIG. 1B is a cross sectional view of the exemplary semiconductor structure of FIG. 1A along the vertical plane B-B'.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1A:
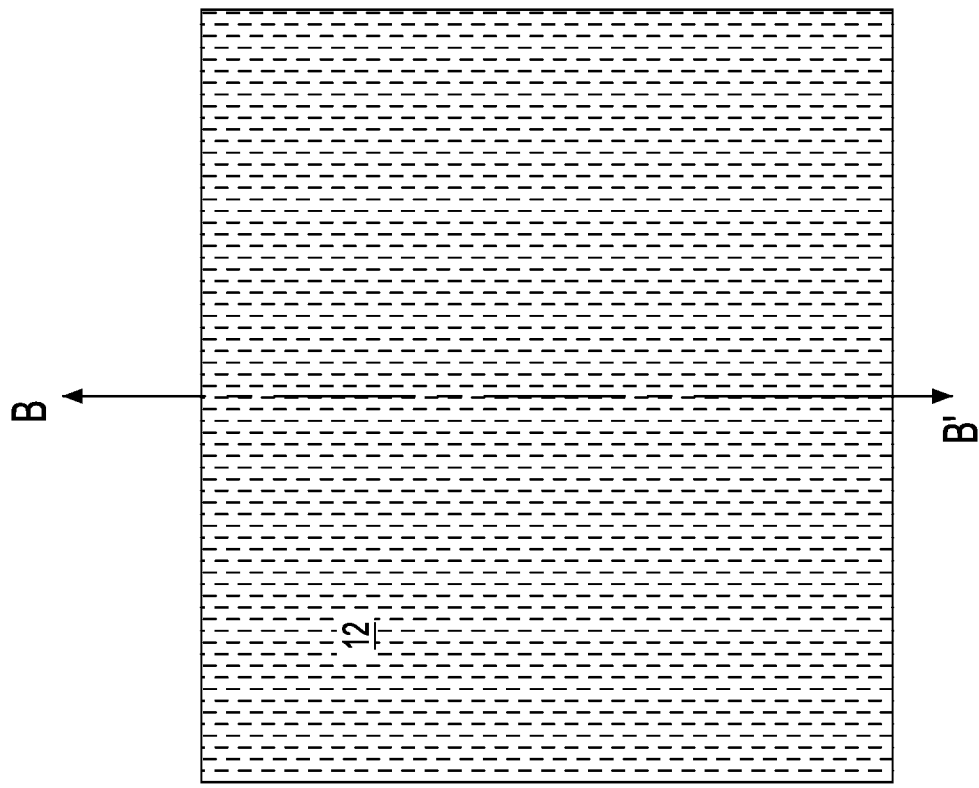
FIG. 1A is a top down view of an exemplary semiconductor structure after forming a semiconductor material stack comprising alternating layers and from bottom to top of silicon/silicon germanium alloy/silicon on a surface of a sacrificial silicon germanium alloy layer that is located on a surface of a semiconductor substrate.

Referring first to FIGS. 1A-1B, there are illustrated various views of an exemplary semiconductor structure after forming a semiconductor material stack (12/14/12) comprising alternating layers and from bottom to top, of silicon 12/silicon germanium alloy 14/silicon 12 on a surface of a sacrificial silicon germanium alloy layer 10 that is present on a semiconductor substrate 8.

The semiconductor substrate 8 that can be employed in the present application is typically a bulk semiconductor substrate. By "bulk semiconductor substrate" it is meant a substrate that is entirely composed of at least one material that has semiconductor properties and no insulator layer is present between any of the materials that have the semiconducting properties. Examples of materials that have semiconducting properties and thus can be employed as the material that provides the semiconductor substrate 8 include, silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

The semiconductor substrate 8 may be doped, undoped or contain regions that are doped and other regions that are non-doped. When doped, an n-type or p-type dopant is introduced into the semiconductor material. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous.

The semiconductor substrate 8 may have any of the well known crystal orientations. For example, the crystal orientation of the semiconductor substrate 8 may be {100}, {110}, or {111}. Other crystallographic orientations besides those specifically mentioned can also be used in the present application. The uppermost portion of the semiconductor substrate 8 is typically a single crystalline semiconductor material.

After selecting a semiconductor substrate 8, the sacrificial silicon germanium alloy layer 10 is formed on an exposed surface of the semiconductor substrate 8. The sacrificial silicon germanium alloy layer 10 can be formed utilizing an epitaxial growth (or deposition) process.

In one embodiment, the epitaxial growth (or deposition) process is a selective epitaxial growth (or deposition) process. The term "selective" when used in conjugation with the phrase "selective epitaxial growth" denotes that the epitaxial material is grown only on semiconductor material surfaces not insulator or conductor surfaces. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

For example, an epitaxial semiconductor material deposited on a {100} crystal surface will take on a {100} orientation. In the present application, the sacrificial silicon germanium alloy layer 10 has an epitaxial relationship as that of the growth surface of the underlying semiconductor substrate 8.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking.

The epitaxial growth of the sacrificial silicon germanium alloy layer 10 can be performed utilizing a precursor gas mixture that includes a silicon containing precursor gas (such as silane) and a germanium containing precursor gas (such as a germane). In another embodiment, the sacrificial silicon germanium alloy layer 10 can be formed utilizing a precursor gas mixture that includes a combined silicon-containing and germanium-containing precursor. Carrier gases like hydrogen, nitrogen, helium and argon can be used. In some embodiments, a dopant (i.e., n-type or p-type) can be introduced into the precursor gas during the epitaxial growth process. In other embodiments, a dopant can be introduced after the epitaxial growth process.

The sacrificial silicon germanium alloy layer 10 may have a germanium content that is from 20 atomic percent germanium to 80 atomic percent germanium, although other germanium contents that are lesser than, or greater than, the aforementioned range may also be used in the present application. Since the sacrificial silicon germanium alloy layer 10 is subsequently removed from the exemplary semiconductor structure of the present application, the sacrificial silicon germanium alloy layer 10 may have a thickness that is greater than the greater thickness of a silicon germanium alloy; the critical thickness is a thickness at which defects begin to form. In one example, the sacrificial silicon germanium alloy layer 10 may have a thickness from 5 nm to 25 nm.

After providing the sacrificial silicon germanium alloy layer 10 on an exposed surface of the semiconductor substrate 8, the semiconductor material stack is formed. As mentioned above, the semiconductor material stack includes alternating layers and from bottom to top, of a lower layer of silicon 12/a silicon germanium alloy 14/an upper layer of silicon 12. In accordance with the present application, the number of layers of silicon 12 within the semiconductor material stack is at least n+1, while the number of layers of silicon germanium alloy 14 within the semiconductor material stack is n, wherein n is any integer beginning from 1; the upper limit of n may vary and can be selected to provide a desired height of semiconductor material fin stacks to be subsequently formed. Thus, each layer of silicon germanium alloy 14 within the semiconductor material stack is sandwiched between an upper layer of silicon 12 and a lower layer of silicon 12. In the exemplary embodiment of the present application, the material stack includes five layers of silicon 12 and four layers of silicon germanium alloy 14 that are formed atop the sacrificial silicon germanium alloy layer 10.

Each layer of silicon 12 of the semiconductor material stack can be formed utilizing an epitaxial growth (or deposition) process as described above for the sacrificial silicon germanium alloy layer 10 except that no germanium precursor material is employed. Each layer of silicon 12 can have a thickness from 5 nm to 20 nm; although other thicknesses that are lesser than, or greater than, the aforementioned thickness range can also be used in the present application. In one embodiment, each layer of silicon 12 of the semiconductor material stack can have a same thickness. In other embodiments, at least two of the layers of silicon 12 of the semiconductor material stack may have different thicknesses. Each layer of silicon 12 may be doped or undoped. In some embodiments, at least one of the layers of silicon 12 can be doped, while at least one other layer of silicon is undoped. The bottommost layer of silicon 12 of the semiconductor material stack may be referred to herein as a nanosheet of silicon. Thus, and at this point of the present application the nanosheet of silicon has a bottommost surface that directly contacts a topmost surface of the sacrificial silicon germanium alloy layer 10.

Each layer of silicon germanium alloy 14 of the semiconductor material stack can be formed utilizing an epitaxial growth (or deposition) process as described above for the sacrificial silicon germanium alloy layer 10. Each layer of silicon germanium alloy 14 can have a germanium content within the range mentioned above for the sacrificial silicon germanium alloy layer 10. In some embodiments, each layer of silicon germanium alloy 14 has a same germanium content. In other embodiments, at least one layer of silicon germanium alloy 14 has a different germanium content than at least one other layer of silicon germanium alloy 14. Each silicon germanium alloy 14 has a thickness that is below its critical thickness. In one example, each silicon germanium alloy 14 can have a thickness from 5 nm to 20 nm; although other thicknesses that are lesser than, or greater than, the aforementioned thickness range can also be used in the present application as long as the thickness value is below the critical thickness. In one embodiment, each layer of silicon germanium alloy 14 of the semiconductor material stack can have a same thickness. In other embodiments, at least two of the layers of silicon germanium alloy 14 of the semiconductor material stack may have different thicknesses. Each layer of silicon germanium alloy 14 may be doped or undoped. In some embodiments, at least one of the layers of silicon germanium alloy 14 can be doped, while at least one other layer of silicon germanium alloy is undoped. The bottommost layer of silicon germanium alloy 14 of the semiconductor material stack may be referred to herein as a lift off isolation layer.

In some embodiments, a hard mask layer (not shown) can be formed atop the topmost silicon layer of the semiconductor material stack. When present, the hard mask layer may include any hard mask material such as, for example, silicon dioxide, silicon nitride, and silicon oxynitride. In one embodiment of the present application, the hard mask material that can provide the hard mask layer can be formed by a deposition process such as, for example, chemical vapor deposition (CVD) or plasma enhanced chemical vapor deposition (PECVD). In another embodiment, the hard mask material that provides the hard mask layer may be formed utilizing a thermal process such as, for example, thermal oxidation and/or thermal nitridation. In some embodiments, a single hard mask material may be used to provide the hard mask layer. In other embodiments, a stack of at least two different hard mask materials, i.e., silicon dioxide/silicon nitride, can be used in providing the hard mask layer. When present, the hard mask layer may have a thickness from 5 nm to 20 nm. Other thicknesses that are lesser than, or greater than, the aforementioned thickness range may also be employed as the thickness of the hard mask layer.

Figure 2B:
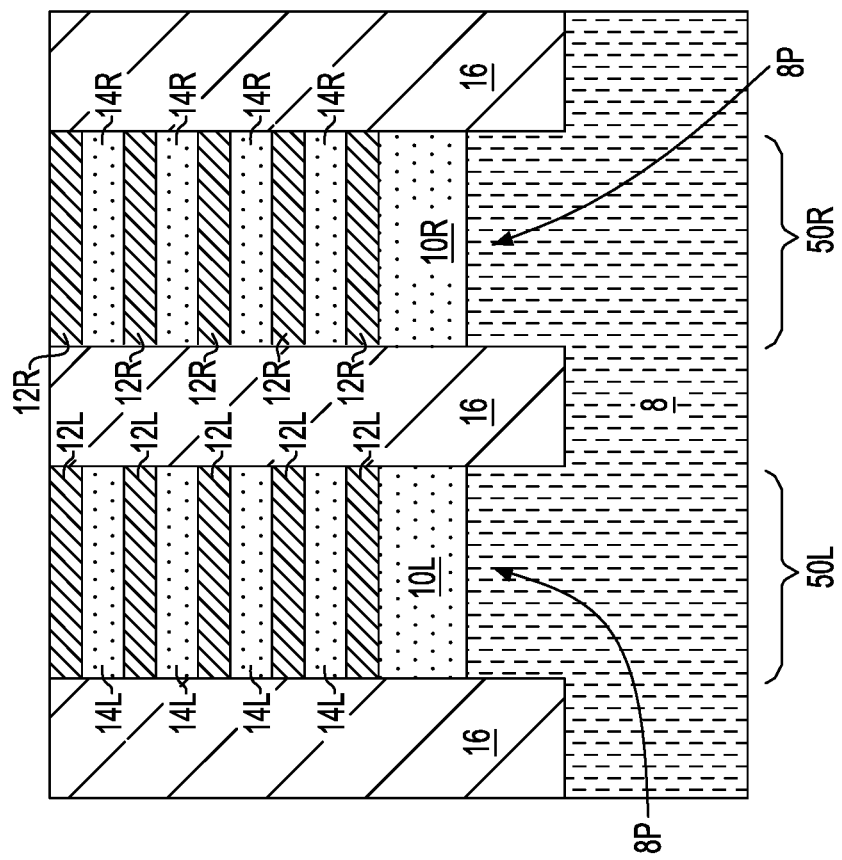
FIG. 2B is a cross sectional view of the exemplary semiconductor structure of FIG. 2A along the vertical plane B-B'.
Figure 2A:
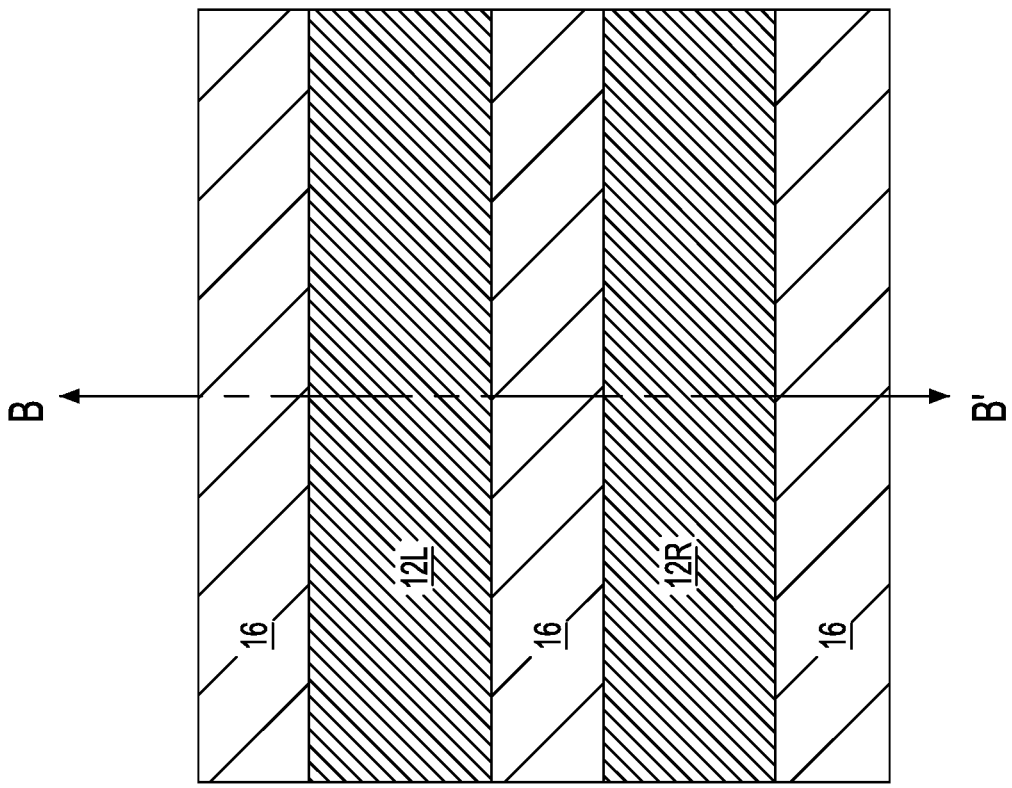
FIG. 2A is a top down view of the exemplary semiconductor structure of FIGS. 1A-1B after forming a plurality of first trench isolation structures having a first depth that extends entirely through the semiconductor material stack and the sacrificial silicon germanium alloy layer and partially through the semiconductor substrate.

Referring now to FIGS. 2A-2B, there are illustrated various views of the exemplary semiconductor structure of FIGS. 1A-1B after forming a plurality of first trench isolation structures 16 having a first depth that extends entirely through the semiconductor material stack (12, 14) and the sacrificial silicon germanium alloy layer 10 and partially through the semiconductor substrate 8. Each first trench isolation structure 16 also has a first width.

The formation of the plurality of first trench isolation structures 16 forms at least one first device region 50L, and at least one second device region 50R. The at least one first device region 50L comprises a region in which a first conductivity-type (p-type or n-type) functional gate structure will be subsequently formed, while the at least one second device region 50R comprises a region in which a second conductivity-type functional gate structure which is opposite from the first conductivity-type is to be subsequently formed. For example, and in one embodiment, the first device region 50L is a region in which a pFET will be subsequently formed, and the second device region 50R is a region in which an nFET will be subsequently formed.

Each first trench isolation structure 16 can be formed by first providing a trench (not shown) which extends completely through the semiconductor material stack (12/14) and the sacrificial silicon germanium alloy layer 10 and partially into the semiconductor structure 8. The trench can be formed by lithography and etching. Lithography includes forming a photoresist material (not shown) atop a material or material stack to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material or material stack to be patterned. The pattern provided by the patterned photoresist material is thereafter transferred into the underlying material layer or material layers utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used. In the illustrated embodiment, the etch stops within a subsurface of the semiconductor substrate 8. By "subsurface" it is meant a surface of the semiconductor substrate that is located between the topmost surface and bottommost surface of the semiconductor substrate 8.

After providing each trench, the trench is then filled with a trench dielectric material such as, for example, silicon dioxide, silicon nitride, or any combination of Si, O, C, B and N, utilizing a deposition process such as, for example, CVD or PECVD. In some embodiments, a densification process and/or a planarization process may follow the trench fill.

The first and second device regions 50L, 50R each include remaining portions of the sacrificial silicon germanium alloy layer 10, and remaining portions of the semiconductor material stack (12, 14) that are located on a pedestal portion 8P of the semiconductor substrate 8. By "pedestal portion" it is meant a non-etched portion of the original semiconductor substrate 8.

Each remaining portion of the sacrificial silicon germanium alloy layer 10 can be referred to herein as a sacrificial silicon germanium alloy layer portion 10L, 10R. Each remaining portion of the layer of silicon 12 can be referred to herein as a silicon portion 12L, 12R, while each remaining portion of the layer of silicon germanium alloy 14 can be referred to herein as a silicon germanium alloy portion 14L, 14R.

As is shown, the sidewalls of the each silicon portion 12L, 12R, the sidewalls of each silicon germanium alloy portion 14L, 14R, the sidewalls of each sacrificial silicon germanium alloy portion 10L, 10R are vertically aligned to the sidewalls of one of the underlying pedestal portions 8P of the semiconductor substrate 8. Also, the sidewalls of the each silicon portion 12L, 12R, the sidewalls of each silicon germanium alloy portion 14L, 14R, the sidewalls of each sacrificial silicon germanium alloy portion 10L, 10R and the sidewalls of each pedestal portion 8P of the semiconductor structure directly contact a sidewall surface of the first trench isolation structure 16.

Within the first device region 50L, the remaining portions of the semiconductor material stack, which includes silicon portions 12L, and silicon germanium alloy portions 14L, can be referred to herein as a first semiconductor nanowire stack structure, while and within the second device region 50R, the remaining portions of the semiconductor material stack, which includes silicon portions 12R, and silicon germanium alloy portions 14R can be referred to herein as a second semiconductor nanowire stack structure.

Figure 3B:
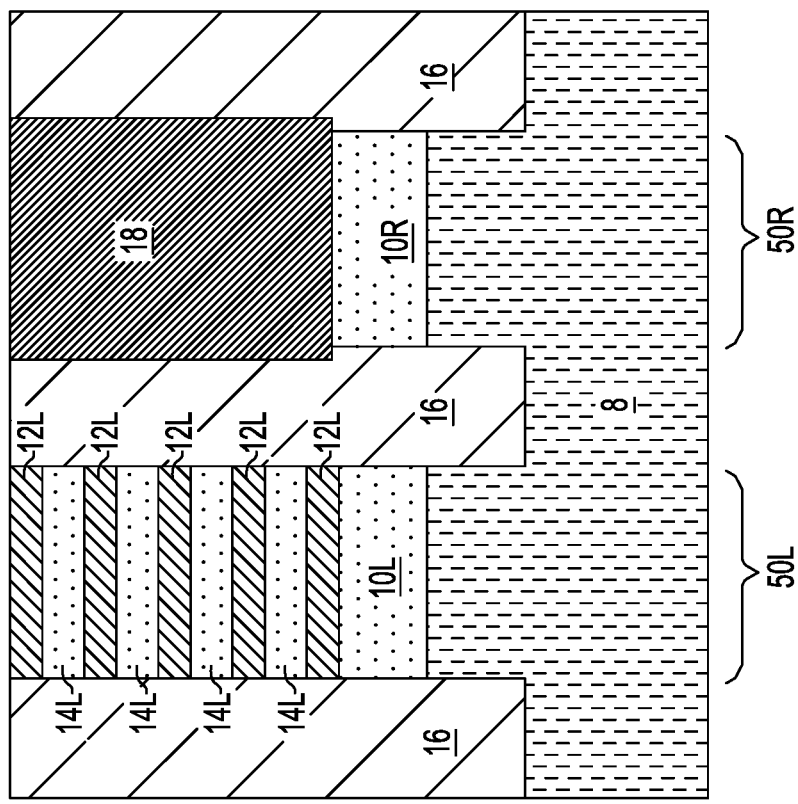
FIG. 3B is a cross sectional view of the exemplary semiconductor structure of FIG. 3A along the vertical plane B-B'.
Figure 3A:
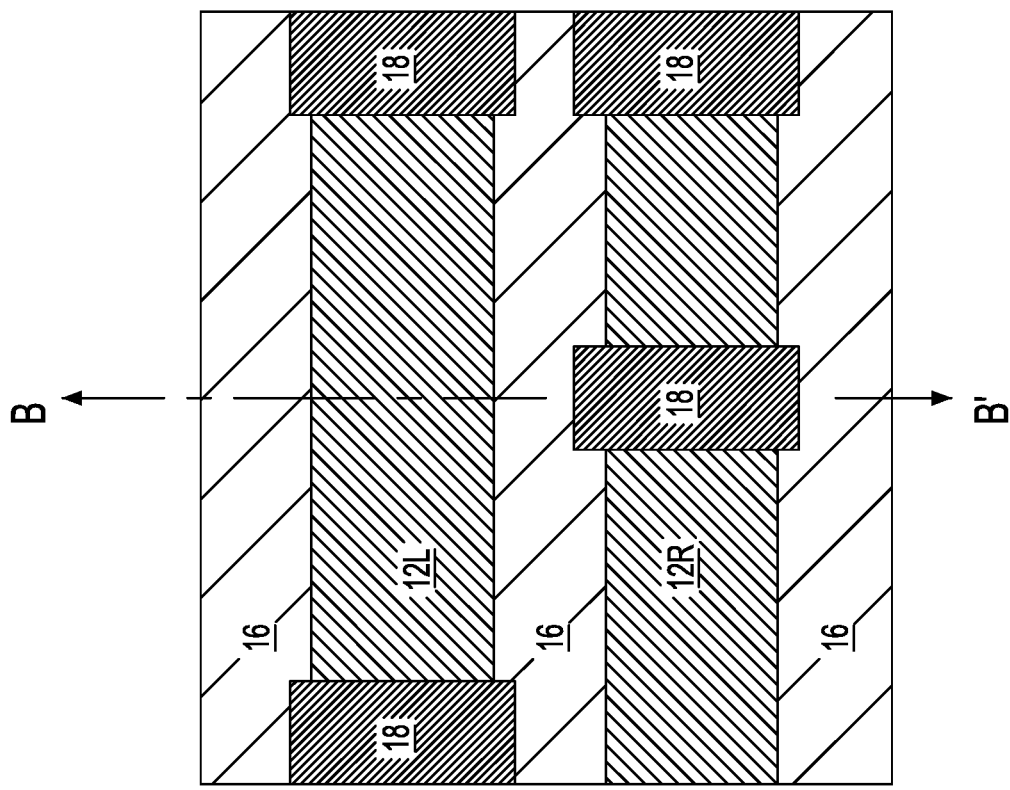
FIG. 3A is a top down view of the exemplary semiconductor structure of FIGS. 2A-2B after forming a plurality of sacrificial trench isolation structures having a second depth that extends to a surface of a remaining portion of the sacrificial silicon germanium alloy layer.

Referring now to FIGS. 3A-3B, there are illustrated various views of the exemplary semiconductor structure of FIGS. 2A-2B after forming a plurality of sacrificial trench isolation structures 18 having a second depth that extends to a surface of a remaining portion of the sacrificial silicon germanium alloy layer (i.e., sacrificial silicon germanium alloy portions 10L, 10R) within the first and second device region 50L, 50R. This steps of the present application serves to cut the first semiconductor nanowire stack structure (12L, 14L) as well as the second semiconductor nanowire stack structure (12R, 14R). Although not shown in the cross sectional view of FIG. 3B, portions of the second semiconductor nanowire stack structure (12R, 14R) remain adjacent to the sacrificial trench isolation structure 18 that is formed during this step of the present application, as can be deduced by the top-down view shown in FIG. 3A. Notably, FIG. 3A shows the presence of a topmost silicon portion 12R and silicon germanium portions 14R and other silicon portions 12R would be located beneath the topmost silicon portion 12R shown in FIG. 3A.

In accordance with the present application, the second depth of each sacrificial trench isolation structure 18 is less than the first depth of the first depth of each first trench isolation structure 16. Also, and in accordance with the present application, each sacrificial trench isolation structure 18 has a second width that is greater than the first width of each first trench isolation structure 16 as well as a width of each first semiconductor nanowire stack structure (12L, 14L) as well as each second semiconductor nanowire stack structure (12R, 14R). As such and as is illustrated in FIGS. 3A-3B, each sacrificial trench isolation structure 18 extends into a portion of each first trench isolation structure 16.

Each sacrificial trench isolation structure 18 can be formed utilizing the processing techniques mentioned above in forming the first trench isolation structures 16. Thus, each sacrificial trench isolation structure 18 can be formed by lithography, etching, and filling a trench with a trench dielectric material. In one embodiment of the present application, the trench dielectric material that provides each sacrificial trench isolation structure 18 is the same trench dielectric material that is used to provide the first trench isolation structures 16. In another embodiment, the trench dielectric material that provides each sacrificial trench isolation structure 18 is a different trench dielectric material than that is used to provide the first trench isolation structures 16.

Figure 4B:
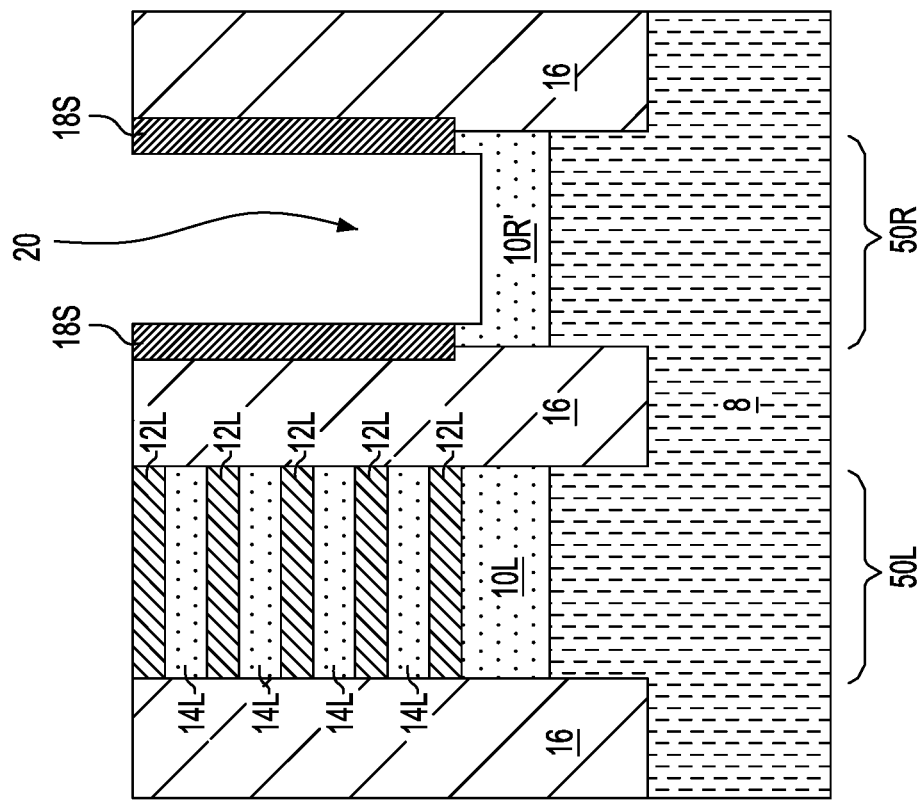
FIG. 4B is a cross sectional view of the exemplary semiconductor structure of FIG. 4A along the vertical plane B-B'.
Figure 4A:
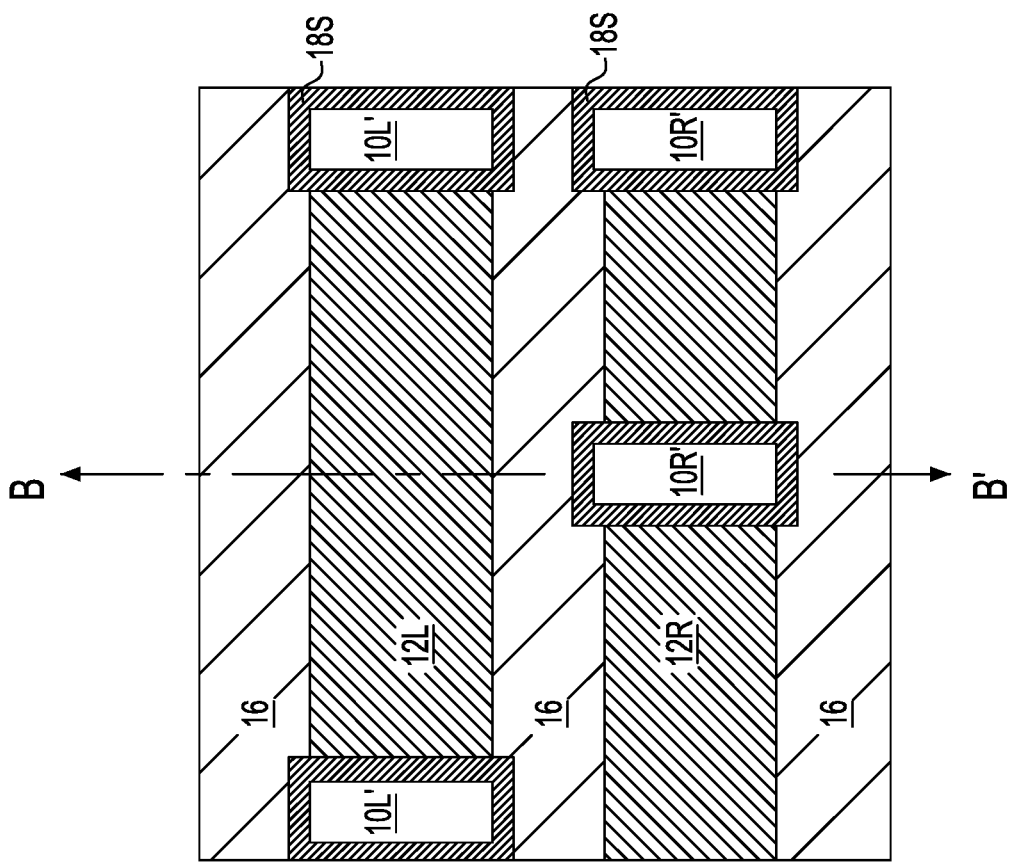
FIG. 4A is a top down view of the exemplary semiconductor structure of FIGS. 3A-3B after removing a portion of each sacrificial trench isolation structure to form an isolation spacer along an upper portion of each first trench isolation structure.

Referring now to FIGS. 4A-4B, there are illustrated various views of the exemplary semiconductor structure of FIGS. 3A-3B after removing a portion of each sacrificial trench isolation structure 18 to form an isolation spacer 18S along an upper portion of each first trench isolation structure 16. Also formed during this step of the present application, is an opening 20 that exposes a topmost surface or a subsurface of the sacrificial silicon germanium alloy portion 10L, 10R within each device region 50L, 50R. In the embodiment shown, opening 20 exposes a subsurface of the sacrificial silicon germanium alloy portion 10R. In one embodiment of the present application, an upper portion of the exposed portion of each sacrificial silicon germanium alloy portion 10L, 10R is removed to provide a U-shaped sacrificial silicon germanium alloy portion 10L', 10R'. Directly beneath the first and second semiconductor nanowire stack structures there remains a non U-shaped portion of the sacrificial silicon germanium alloy portion 10L, 10R, one of which is clearly depicted in FIG. 4B of the present application. Isolation spacers 18S typically have a width of from 5 nm to 20 nm. Although not shown in the cross sectional view of FIG. 4B, portions of the second semiconductor nanowire stack structure (12R, 14R) remain, as can be deduced by the top-down view shown in FIG. 4A. Notably, FIG. 4A shows the presence of a topmost silicon portion 12R and silicon germanium portions 14R and other silicon portions 12R would be located beneath the topmost silicon portion 12R shown in FIG. 4A.

The exemplary semiconductor structure shown in FIGS. 4A-4B can be formed by lithography and anisotropic etching. The anisotropic etch may include a single etch or multiple etching processes can be employed. As is shown, the isolation spacer 18S has a bottommost surface that contacts a vertically extending portion of each U-shaped sacrificial silicon germanium alloy portion 10L', 10R' that is present within the first and second device regions 50L, 50R.

In some embodiments and instead of forming the isolation spacers 18S from the sacrificial trench isolation structures 18, isolation spacers 18S can be formed by first providing a trench opening having the second depth that extends to a surface of a remaining portion of the sacrificial silicon germanium alloy layer (i.e., sacrificial silicon germanium alloy portions 10L, 10R) within the first and second device region 50L, 50R. A dielectric spacer such as, for example, silicon dioxide, silicon nitride, or any combination of Si, O, C, B and N can then be deposited. A spacer etch is then employed to form the isolation spacers 18S.

Figure 5B:
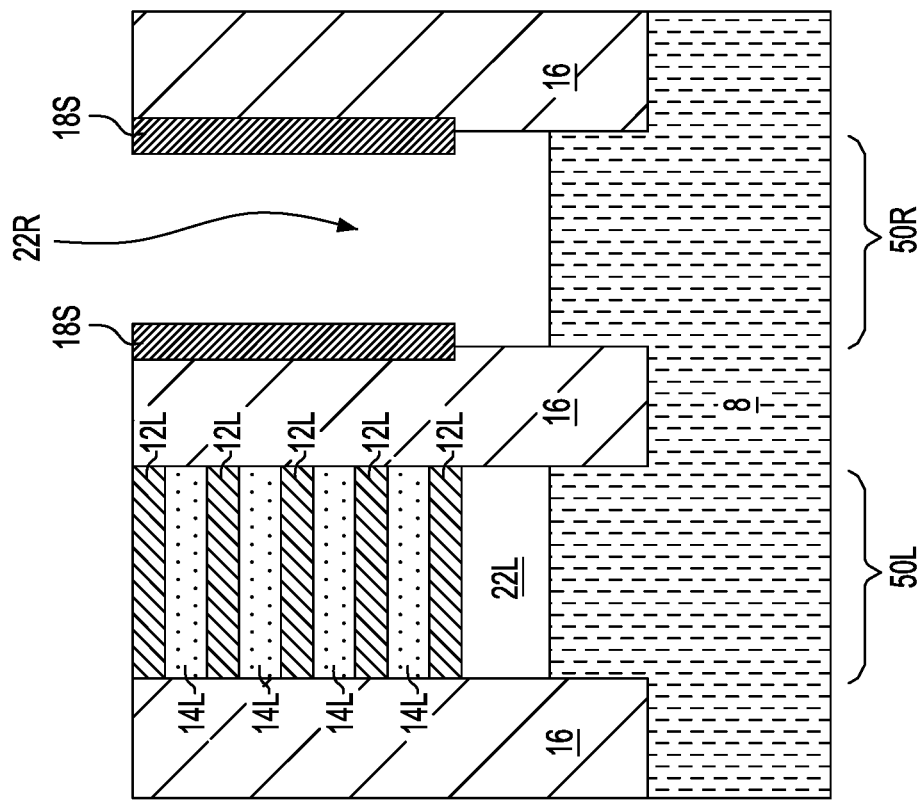
FIG. 5B is a cross sectional view of the exemplary semiconductor structure of FIG. 5A along the vertical plane B-B'.
Figure 5A:
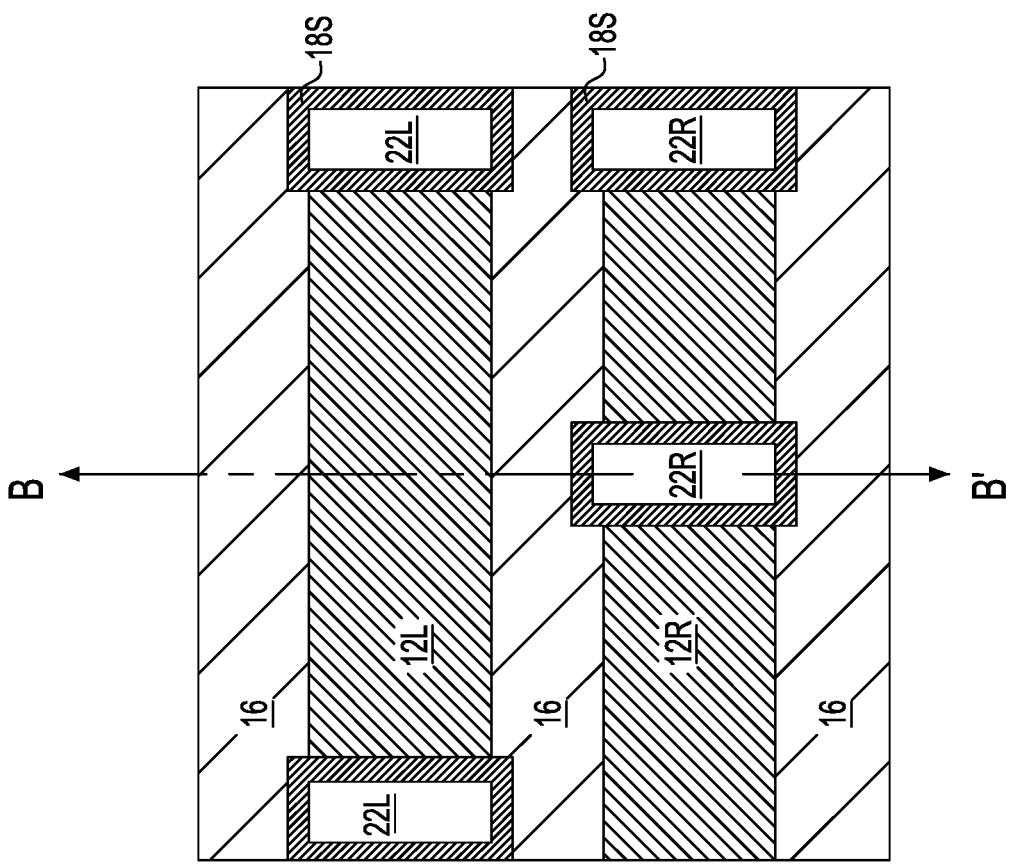
FIG. 5A is a top down view of the exemplary semiconductor structure of FIGS. 4A-4B after removing each remaining portion of the sacrificial silicon germanium alloy layer.

Referring now to FIGS. 5A-5B, there are illustrated various views of the exemplary semiconductor structure of FIGS. 4A-4B after removing each remaining portion of the sacrificial silicon germanium alloy layer (i.e., U-shaped sacrificial silicon germanium alloy portion 10L', 10R' as well as the non U-shaped sacrificial silicon germanium alloy portion 10L, 10R). It is observed that none of the silicon germanium alloy portions 14L, 14R of the first and second semiconductor nanowire stack structures are removed since the end portions of the silicon germanium alloy portions 14L, 14R of the first and second semiconductor nanowire stack structures are protected by portions of the first trench isolation structure 16. Although not shown in the cross sectional view of FIG. 5B, portions of the second semiconductor nanowire stack structure (12R, 14R) remain, as can be deduced by the top-down view shown in FIG. 5A. Notably, FIG. 5A shows the presence of a topmost silicon portion 12R and silicon germanium portions 14R and other silicon portions 12R would be located beneath the topmost silicon portion 12R shown in FIG. 5A.

As is shown, openings 22L and 22R are formed in the first and second device regions 50L and 50R, respectively. Each opening 22L, 22R has a portion that is located directly beneath the first and second semiconductor nanowire stack structures (12L/14L and 12R/14R). Each opening 22L, 22R also has a portion that is surrounded by the isolation spacer 18S.

The removal of the remaining portion of the sacrificial silicon germanium alloy layer (i.e., U-shaped sacrificial silicon germanium alloy portion 10L', 10R' as well as the non U-shaped sacrificial silicon germanium alloy portion 10L, 10R) can be performed utilizing an etching process that is selective in removing a silicon germanium alloy as compared to silicon and a trench dielectric material. In one embodiment, the remaining portion of the sacrificial silicon germanium alloy layer (i.e., U-shaped sacrificial silicon germanium alloy portion 10L', 10R' as well as the non U-shaped sacrificial silicon germanium alloy portion 10L, 10R) can be removed utilizing an HCl based etchant for a dry etch process or an HF based etchant for a wet etch process.

After removing remaining portion of the sacrificial silicon germanium alloy layer (i.e., U-shaped sacrificial silicon germanium alloy portion 10L, 10R as well as the non U-shaped sacrificial silicon germanium alloy portion 10L', 10R'), the first and second semiconductor nanowire stack structures are now suspended above the pedestal portion 8P of the semiconductor substrate 8. Also, and after removing remaining portion of the sacrificial silicon germanium alloy layer (i.e., U-shaped sacrificial silicon germanium alloy portion 10L, 10R as well as the non U-shaped sacrificial silicon germanium alloy portion 10L', 10R'), the bottommost surface of the bottommost silicon portion 12L, 12R of the first and second semiconductor nanowire stack structures is now exposed.

Referring now to FIGS. 6A-6B, there are illustrated the exemplary semiconductor structure of FIGS. 5A-5B after forming a second trench isolation 24L, 24R having a third depth that is less than the first depth but greater than the second depth mentioned above. Each second trench isolation structure 24L, 24R is present in one of the openings 22L, 22R and has a portion that extends directly beneath one of the first and second semiconductor nanowire structures (12L/14L and 12R/14R). Each second trench isolation structure 24L, 24R has another portion that is surrounded by the isolation spacers 18S. Each second trench isolation structure 24L, 24R can be formed by filling the entirety of openings 22L, 22R with a trench dielectric material. The trench dielectric material that provides the second trench isolation structures 24L, 24R can be the same or different from the trench dielectric material that provides the first trench isolation structure 16. In one example, each second trench isolation structure 24L, 24R and each first trench isolation structure 16 comprise silicon dioxide. A planarization process may follow the filling of the openings 22L, 22R with the trench dielectric material. Although not shown in the cross sectional view of FIG. 6B, portions of the second semiconductor nanowire structure stack (12R, 14R) remain, as can be deduced by the top-down view shown in FIG. 6A. Notably, FIG. 6A shows the presence of a topmost silicon portion 12R and silicon germanium portions 14R and other silicon portions 12R would be located beneath the topmost silicon portion 12R shown in FIG. 6A.

Figure 7B:
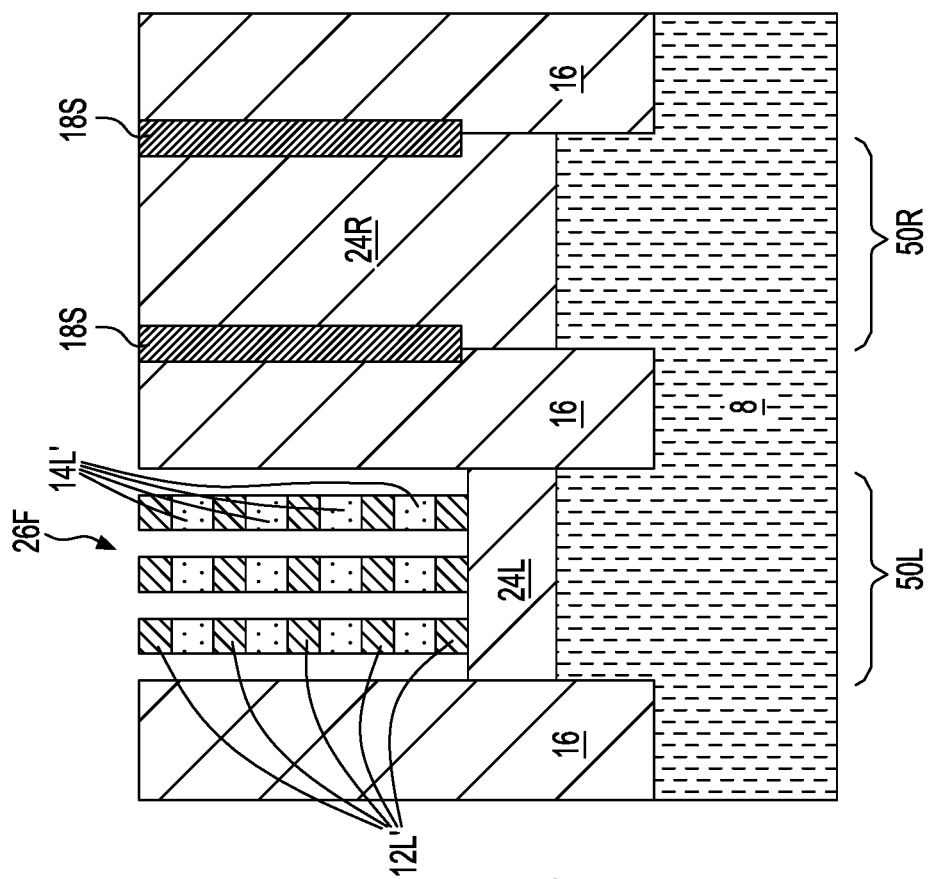
FIG. 7B is a cross sectional view of the exemplary semiconductor structure of FIG. 7A along the vertical plane B-B'.
Figure 7A:
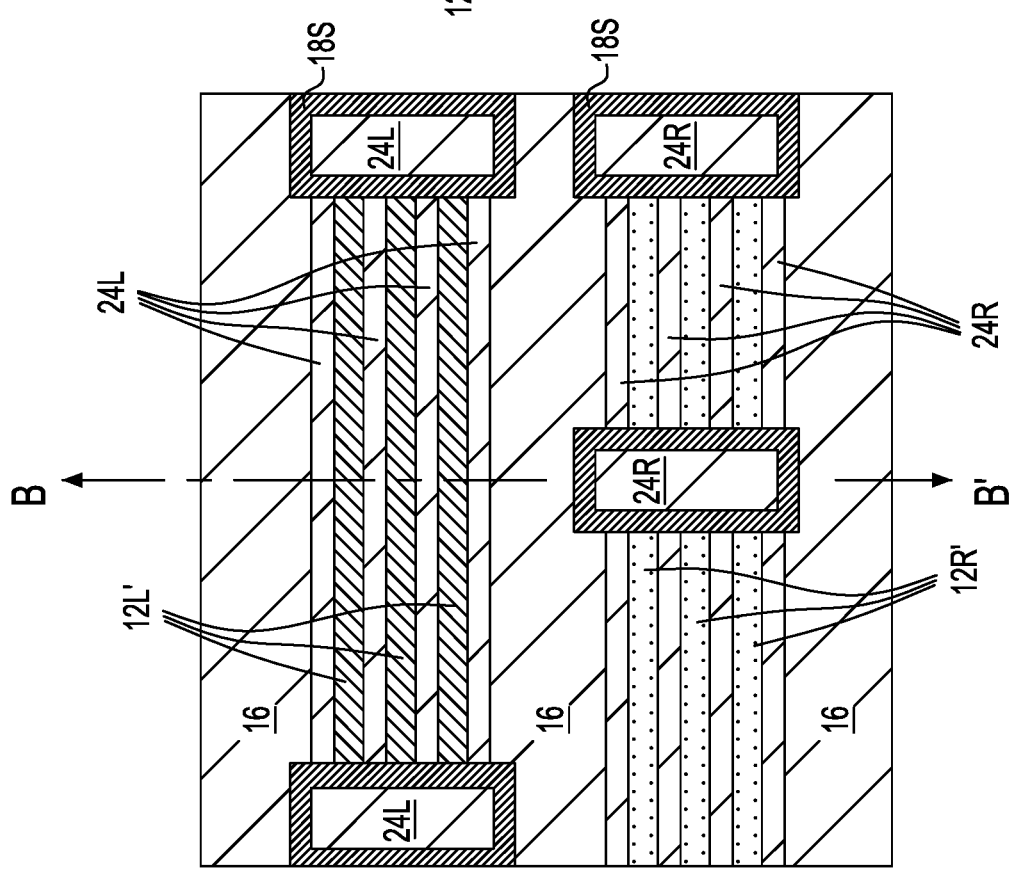
FIG. 7A is a top down view of the exemplary semiconductor structure of FIGS. 6A-6B after patterning the remaining portions of each semiconductor material stack to provide semiconductor material fin stacks.

Referring now to FIGS. 7A-7B, there are illustrated various views of the exemplary semiconductor structure of FIGS. 6A-6B after patterning the remaining portions of each semiconductor material stack (i.e., the first and second semiconductor nanowire stack structures 12L/14L and 12R/14R) to provide semiconductor material fin stacks 26F, 28F. Semiconductor material fin stack 26F is present in the first device region 50L, while semiconductor material fin stack 28F is present in the second device region 50R. Semiconductor material fin stack 26F may be referred to herein as first semiconductor material fin stack, while semiconductor material fin stack 28F may be referred to herein as a second semiconductor material fin stack. In accordance with the present each first semiconductor material fin stack 26F includes silicon fin portions 12L' and silicon germanium alloy fin portions 14L', while each second semiconductor material fin stack 28F includes silicon fin portions 12R' and silicon germanium alloy fin portions (not shown in top down view of FIG. 7A or the cross sectional view of FIG. 7B).

In one embodiment of the present application, the patterning may include lithography and etching, as defined above in forming the trench for the plurality of first trench isolation structures 16. In the illustrated embodiment, the etch stops on the topmost surface of the insulator structure 24L.

In another embodiment, the patterning process may include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon, polysilicon, silicon nitride or carbon. In another embodiment, the mandrel material layer (not shown) may be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a spacer on each sidewall of each mandrel structure. The spacer can be formed by deposition of a spacer material and then etching the deposited spacer material. The spacer material may comprise any spacer material that has a different etch selectivity than the mandrel material. Examples of deposition processes that can be used in providing the spacer material include, for example, chemical vapor deposition (CVD), plasma enhanced chemical vapor deposition (PECVD), or atomic layer deposition (ALD). Examples of etching that be used in providing the spacers include any etching process such as, for example, reactive ion etching.

After formation of the spacers, the SIT process continues by removing each mandrel structure. Each mandrel structure can be removed by an etching process that is selective for removing the mandrel material. Following the mandrel structure removal, the SIT process continues by transferring the pattern provided by the spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the spacers from the structure. Each spacer may be removed by etching or a planarization process.

As used herein, a "semiconductor material fin stack" refers to a stack of semiconductor materials (in the present case alternating Si fin portions (12L', 12R')/SiGe fin portions (14L', 14R')), and including a pair of vertical sidewalls that are parallel to each other. As used herein, a surface is "vertical" if there exists a vertical plane from which the surface does not deviate by more than three times the root mean square roughness of the surface. In one embodiment of the present application, each semiconductor material stack has a width from 4 nm to 30 nm. Other widths that is lesser than, or greater than the range mentioned herein can also be used in the present application. Each semiconductor material stack within a given device region is spaced apart from its nearest neighboring semiconductor material fin stack by a pitch of from 20 nm to 100 nm. Also, each semiconductor material fin stack is oriented parallel to each other.

As is shown in FIG. 7B and in one embodiment of the present application, the topmost Si fin portion of each semiconductor material fin stack 26F, 28F is coplanar with a topmost surface of each first trench isolation structure 16.

Notably, FIGS. 7A-7B illustrate an exemplary semiconductor structure of the present application which includes a semiconductor substrate 8 including a first device region 50L and a second device region 50R. First trench isolation structures 16 surround the first and second device regions (50L, 50R) and extend below first and second pedestal portions 8P of the semiconductor substrate 8; the first pedestal portion is located in the first device region 50L, while the second pedestal portion is located in the second device region 50R. A first semiconductor material fin stack 26F is located above the first pedestal portion 8P of the semiconductor substrate 8, and a second semiconductor material fin stack 28F is located above the second pedestal portion 8P of the semiconductor substrate 8. Second trench isolation structures (24L, 24R) are located at ends of each first and second semiconductor material fin stacks (26F, 28F), wherein a portion of one of the second trench isolation structures 24L is located directly between a bottommost surface of the first semiconductor material fin stack 26F and the first pedestal portion 8P of the semiconductor substrate 8 and a portion of other of the second trench isolation structure 24R is located directly between a bottommost surface of the second semiconductor material fin stack 28F and the second pedestal portion 8P of the semiconductor substrate 8.

As is shown, the portion of the second trench isolation structure 24L that is located directly between the bottommost surface of the first semiconductor material fin stack 26F and the first pedestal portion of the semiconductor substrate and the portion of the second trench isolation structure 24R that is located directly between the bottommost surface of the second semiconductor material fin stack 28F contacts a sidewall surface of one of the first trench isolation structures 16. As is further shown, the first and second trench isolation structures have topmost surfaces that are coplanar with each and coplanar with a topmost surface of each first and second semiconductor material fin stack (26F, 28F). Also, the first trench isolation structures 16 surround the first and second semiconductor material fin stacks (26F, 28F) and each first and second semiconductor material fin stack is located between a neighboring pair of first trench isolation structures 16.

In accordance with the present application, the first trench isolation structures 16 are located along the entire lengthwise direction of the first and second semiconductor material fin stacks 26F, 28F, while the second trench isolation structures 24L, 24R are located at the ends and along the entire widthwise direction of the first and second semiconductor material fin stacks 26F, 28F.

Figure 8B:
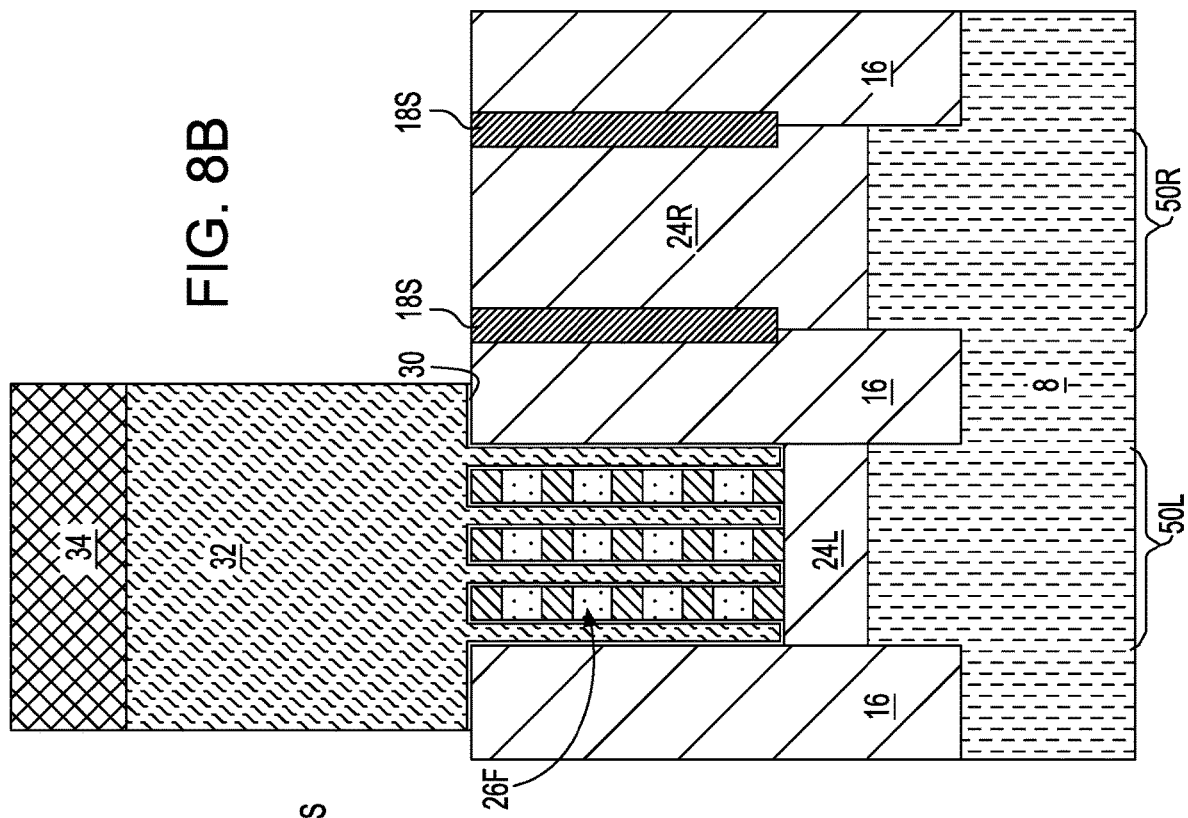
FIG. 8B is a cross sectional view of the exemplary semiconductor structure of FIG. 8A along the vertical plane B-B'.
Figure 8A:
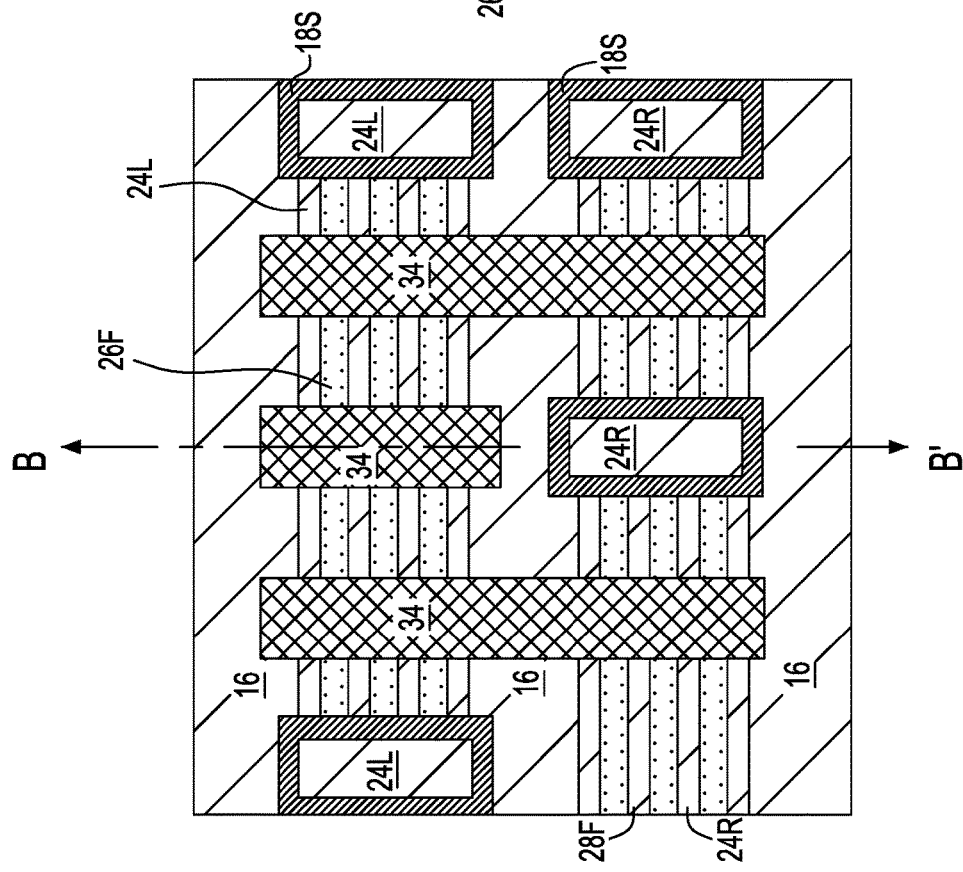
FIG. 8A is a top down view of the exemplary semiconductor structure of FIGS. 8A-8B after forming a gate structure straddling over each semiconductor material fin stack.

Referring now to FIGS. 8A-8B, there are illustrated various views of the exemplary semiconductor structure of FIGS. 8A-8B after forming a gate structure straddling over each semiconductor material fin stack 26F, 28F). By "straddling over" it is meant that one material is formed atop and along sidewall surfaces of another material. In one embodiment of the present application, each gate structure is a functional gate structure. By "functional gate structure" it is meant a permanent gate structure used to control output current (i.e., flow of carriers in the channel) of a semiconducting device through electrical or magnetic fields. Each functional gate structure includes a gate material stack of, from bottom to top, a gate dielectric portion 30 and a gate conductor portion 32. In some embodiments, a gate cap portion 34 can be present atop at least the gate conductor portion 32.

In accordance with an embodiment of the present application, one of the functional gate structures straddles over a portion of the first semiconductor fin stack 26F (but not the second semiconductor fin stack 28F), while at least one other functional gate structure straddles over another portion of the first semiconductor fin stack 26F and a portion of the second semiconductor fin stack 28F. In accordance with an embodiment of the present application, a portion of each functional gate structure is located between an upper portion of a neighboring pair of first trench isolation structures 16.

The gate dielectric portion 30 may include a gate dielectric material. The gate dielectric material that provides the gate dielectric portion 30 can be an oxide, nitride, and/or oxynitride. In one example, the gate dielectric material that provides the gate dielectric portion 30 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric portion 30. In some embodiments, a first set of functional gate structures includes a first gate dielectric portion, while a second set of functional gate structures comprises a second gate dielectric portion. In such an embodiment, the first gate dielectric material portion may be the same as, or different from, the second gate dielectric material portion.

The gate dielectric material used in providing the gate dielectric portion 30 can be formed by any deposition process including, for example, chemical vapor deposition (CVD), plasma enhanced chemical vapor deposition (PECVD), physical vapor deposition (PVD), sputtering, or atomic layer deposition. In some embodiments and when different gate dielectric materials are used in providing the gate dielectric portions of different functional gate structures, block mask technology can be used. In one embodiment of the present application, the gate dielectric material used in providing the gate dielectric portion 30 can have a thickness in a range from 1 nm to 10 nm. Other thicknesses that are lesser than, or greater than, the aforementioned thickness range can also be employed for the gate dielectric material that may provide the gate dielectric portion 30.

The gate conductor portion 32 can include a gate conductor material. The gate conductor material used in providing the gate conductor portion 32 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, a first set of functional gate structures includes a first gate conductor portion, while a second set of functional gate structures comprises a second gate conductor portion. In such an embodiment, the first gate conductor portion may be the same as, or different from, the second gate conductor portion. For example, the first gate conductor portion may comprise an nFET gate metal, while the second gate conductor portion may comprise a pFET gate metal. In another example, the first gate conductor portion may comprise a pFET gate metal, while the second gate conductor portion may comprise an nFET gate metal.

The gate conductor material used in providing the gate conductor portion 32 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for gate conductor portions of different functional gate structures, block mask technology can be used. In one embodiment, the gate conductor material used in providing the gate conductor portion 32 has a thickness from 100 nm to 300 nm. Other thicknesses that are lesser than, or greater than, the aforementioned thickness range can also be employed for the gate conductor material used in providing the gate conductor portion 32. After deposition of the gate conductor material a planarization process may be employed prior to further processing.

If present, gate cap portion 34 of the functional gate structure may include a gate cap material. The gate cap material that provides the gate cap portion 34 may include a hard mask material such as, for example, silicon dioxide, silicon nitride, silicon oxynitride and/or any combination of Si, O, N, B and C. The gate cap portion 34 can be a single layered structure or a multilayered structure. When a plurality of functional gate structures are formed, the hard mask material of a first gate gap portion of a first set of functional gate structure may be the same as, or different from, the hard mask material of a second gate gap portion of a second set of functional gate structures. The hard mask material that provides the gate cap portion 34 can be formed utilizing a conventional deposition process such as, for example, chemical vapor deposition or plasma enhanced chemical vapor deposition. The material that provides the gate cap portion 34 can have a thickness from 10 nm to 60 nm. Other thicknesses that are lesser than, or greater than, the aforementioned thickness range can also be employed as the thickness of the material that provides the gate cap portion 34.

The functional gate structure can be formed by providing a functional gate material stack of, from bottom to top, the gate dielectric material, the gate conductor material and, if present, the gate cap material. A patterning process may follow the formation of the functional gate material stack. Gate patterning may include single exposure DUV or multiple exposure with a combination of lithography and reactive ion etch patterning or SIT patterning and EUV patterning.

Next, gate spacer (not shown) can be formed around each gate structure. The gate spacer is present on the vertical sidewall surfaces of the gate dielectric portion 30 and the vertical sidewalls of the gate conductor portion 32 and if present the vertical sidewall so the gate cap portion 34. A base of the gate spacer may contact a topmost surface of some of the first trench isolation structures. The gate spacer may include any gate dielectric spacer material such as, for example, silicon dioxide and/or silicon nitride. The gate spacer can be formed by deposition of a gate dielectric spacer material and thereafter etching the deposited gate dielectric spacer material. After gate spacer formation, source/drain regions can be formed within and/or upon exposed portions of each semiconductor material fin stack not covered by the gate structure and gate spacer.

In other embodiments of the present application, and prior to forming a functional gate structure, a sacrificial gate structure is formed instead. In yet other embodiments and when multiple gate structures are formed, at least one of the gate structures is a functional gate structure, and at least one other of the gate structures is a sacrificial gate structure. By "sacrificial gate structure" it is meant a material or material stack that serves as a placeholder for a subsequently formed functional gate structure. In such a process, the functional gate structure is formed after the source/drain regions have been formed. In such an embodiment, the gate dielectric portion of the functional gate structure that replaces the sacrificial gate structure may be U-shaped. By "U-shaped" it is meant a material that includes a bottom horizontal surface and a sidewall surface that extends upward from the bottom horizontal surface. When employed, each sacrificial gate structure may include a sacrificial gate dielectric portion, and/or a sacrificial gate material portion. Each sacrificial gate dielectric portion includes one of the dielectric materials mentioned above for gate dielectric portion. Each sacrificial gate material portion includes one of the gate conductor materials mentioned above for the gate conductor portion. The sacrificial gate structure can be formed by deposition of the various material layers and then patterning the resultant sacrificial dielectric material sack by utilizing, for example, lithography and etching. Next, gate spacers as mentioned above, and after formation of the source/drain regions, the sacrificial gate structure may be replaced with a functional gate structure as described above.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a semiconductor substrate including a first device region and a second device region, wherein first trench isolation structures surround said first and second device regions and extend below first and second pedestal portions of said semiconductor substrate;
a first semiconductor material fin stack located above said first pedestal portion of said semiconductor substrate;
a second semiconductor material fin stack located above said second pedestal portion of said semiconductor substrate; and
second trench isolation structures located at ends of each first semiconductor material fin stack and said second semiconductor material fin stack, wherein a portion of one of said second trench isolation structures is located directly between a bottommost surface of said first semiconductor material fin stack and said first pedestal portion of said semiconductor substrate and another of said second trench isolation structures is located directly between a bottommost surface of said second semiconductor material fin stack and said second pedestal portion of said semiconductor substrate, and wherein said first trench isolation structures have a depth that is greater than a depth of said second trench isolation structures.

2. The semiconductor structure of claim 1, wherein an isolation spacer is located on upper portion of sidewall surfaces of said first trench isolation structure and surrounding an upper portion of said second trench isolation structures.

3. The semiconductor structure of claim 2, wherein a topmost surface of said isolation spacer is coplanar with a topmost surface of said first trench isolation structures.

4. The semiconductor structure of claim 1, wherein a topmost surface of said first and second semiconductor material fin stacks is coplanar with a topmost surface of said first trench isolation structures.

5. The semiconductor structure of claim 1, wherein each of said first and second semiconductor material fin stacks comprises from bottom to top, alternating layers of silicon and a silicon germanium alloy, wherein each layer of silicon germanium alloy is sandwiched by a lower layer of silicon and an upper layer of silicon.

6. The semiconductor structure of claim 1, further comprising at least one functional gate structure straddling over at least one of said first and second semiconductor material fin stacks.

7. The semiconductor structure of claim 1, wherein a portion of said at least one functional gate structure is located between a neighboring pair of first trench isolation structures, and another portion of said at least one functional gate structure is located above said neighboring pair of first trench isolation structures.

8. The semiconductor structure of claim 1, wherein said semiconductor substrate is a bulk semiconductor substrate.

9. The semiconductor structure of claim 1, further comprising a first functional gate structure straddling over a portion of said first semiconductor fin stack, and a second functional gate structure straddling over another portion of said first semiconductor fin stack and a portion of said second semiconductor fin stack.

10. The semiconductor structure of claim 1, wherein said first trench isolation structures are located along an entire lengthwise direction of said first and second semiconductor fin stacks.

11. The semiconductor structure of claim 1, wherein said first trench isolation structures and said second trench isolation structures have topmost surfaces that are coplanar with each other.

12. The semiconductor structure of claim 2, wherein said isolation spacer includes a first portion that extends into one of said first trench isolation structures and a second portion that extends into one of said second trench isolation structures.

13. The semiconductor structure of claim 2, wherein said isolation spacer has a bottommost surface that is located above a bottommost surface of said first trench isolation structures and above a bottommost surface of said second trench isolation structures.

14. The semiconductor structure of claim 2, wherein said isolation spacer comprises silicon dioxide or silicon nitride.

15. The semiconductor structure of claim 2, wherein said isolation spacer comprises any combination of Si, O, C, B and N.

16. The semiconductor structure of claim 1, wherein said first trench isolation structures comprise a same trench dielectric material as said second trench isolation structures.

17. The semiconductor structure of claim 1, wherein said first trench isolations structures comprise a different trench dielectric material than said second trench isolation structures.

18. A semiconductor structure comprising:

a semiconductor substrate including a first device region and a second device region, wherein first trench isolation structures surround said first and second device regions and extend below first and second pedestal portions of said semiconductor substrate;

a first semiconductor material fin stack located above said first pedestal portion of said semiconductor substrate;

a second semiconductor material fin stack located above said second pedestal portion of said semiconductor substrate; and second trench isolation structures located at ends of each first semiconductor material fin stack and said second semiconductor material fin stack, wherein a portion of one of said second trench isolation structures is located directly between a bottommost surface of said first semiconductor material fin stack and said first pedestal portion of said semiconductor substrate and another of said second trench isolation structures is located directly between a bottommost surface of said second semiconductor material fin stack and said second pedestal portion of said semiconductor substrate, and wherein said first trench isolation structures comprise a different trench dielectric material than said second trench isolation structures.

* * * * *